(12) United States Patent
Saito (10) Patent No.: US 12,555,921 B2
(45) Date of Patent: Feb. 17, 2026

(54) ELECTROMAGNETIC WAVE ABSORBER EVALUATION APPARATUS AND ELECTROMAGNETIC WAVE ABSORBER EVALUATION METHOD

(71) Applicant: DAIDO STEEL CO., LTD., Nagoya (JP)

(72) Inventor: Akihiko Saito, Nagoya (JP)

(73) Assignee: Daido Steel Co., Ltd., Nagoya (JP)

(*) Notice: Subject to any disclaimer, the term of this patent is extended or adjusted under 35 U.S.C. 154(b) by 219 days.

(21) Appl. No.: 18/381,766

(22) Filed: Oct. 19, 2023

(65) Prior Publication Data

US 2024/0136731 A1 Apr. 25, 2024
US 2024/0235051 A9 Jul. 11, 2024

(30) Foreign Application Priority Data

Oct. 21, 2022 (JP) ................. 2022-168793

(51) Int. Cl.
*H01Q 17/00* (2006.01)
*H05K 9/00* (2006.01)

(52) U.S. Cl.
CPC ......... *H01Q 17/007* (2013.01); *H05K 9/0069* (2013.01); *H05K 9/0081* (2013.01)

(58) Field of Classification Search
CPC ... H01Q 17/007; H05K 9/0069; H05K 9/0081
USPC ............................................. 342/1
See application file for complete search history.

(56) References Cited

U.S. PATENT DOCUMENTS

| 2008/0084259 A1* | 4/2008 | Yoshida | H01Q 17/002 |
| | | | 333/243 |
| 2015/0027771 A1* | 1/2015 | Kagawa | H01Q 17/00 |
| | | | 174/350 |
| 2018/0103564 A1* | 4/2018 | Saito | H05K 9/0083 |

FOREIGN PATENT DOCUMENTS

| JP | 2004143347 A | * | 5/2004 | |
| WO | WO-2021187009 A1 | * | 9/2021 | H01Q 17/00 |

* cited by examiner

*Primary Examiner* — William Kelleher
*Assistant Examiner* — Samarina Makhdoom
(74) *Attorney, Agent, or Firm* — McGinn IP Law Group PLLC (57) ABSTRACT

An electromagnetic wave absorber evaluation apparatus including: a housing in which the electromagnetic wave absorber is allowed to be arranged, the housing being made of a conductive material with inner dimensions of a width a, a height b, and a length L, as b<a<L; a substrate arranged inside the housing; an input microstrip line and an output microstrip line formed on the substrate along a length direction of the housing and separated from each other in the length direction; and a signal inspecting unit capable of inputting an input signal having a frequency of 20 GHz or more into the input microstrip line and detecting an output signal output through the output microstrip line, in which an evaluation frequency $f_r$ obtained by the Formula (1) satisfies the Formula (2) in a frequency region of 20 GHz or more.

10 Claims, 6 Drawing Sheets

ELECTROMAGNETIC WAVE ABSORBER EVALUATION APPARATUS AND ELECTROMAGNETIC WAVE ABSORBER EVALUATION METHOD

CROSS-REFERENCE TO RELATED APPLICATIONS

This application is based on and claims priority under 35 USC 119 from Japanese Patent Application No. 2022-168793 filed on Oct. 21, 2022.

TECHNICAL FIELD

The present invention relates to an electromagnetic wave absorber evaluation apparatus and an electromagnetic wave absorber evaluation method, and more particularly to an electromagnetic wave absorber evaluation apparatus and an electromagnetic wave absorber evaluation method that are used for evaluating characteristics of an electromagnetic wave absorber in a millimeter waveband or a quasi-millimeter waveband.

BACKGROUND ART

In a high-frequency communication device that includes a processing circuit for processing an input signal and outputting a signal, there is a problem that coupling (electromagnetic field coupling) via electromagnetic waves occurs between the input signal and the output signal. In particular, in the case where the processing circuit is accommodated in a metal housing, such coupling is promoted due to the propagation and resonance of the electromagnetic waves in the housing. As a communication frequency is increased, the problem of coupling becomes remarkable. In recent years, many communication devices using a frequency in a millimeter wave region have been commercially available, but in these communication devices that perform communication in a high-frequency region such as a millimeter wave region or a quasi-millimeter wave region, the problem of coupling in the housing becomes serious.

In the high-frequency communication device, as one of methods for reducing coupling between signals in a circuit, such as between the input signal and the output signal, a method for setting an electromagnetic wave absorber at a portion covering the processing circuit, such as the inside of the metal housing, is used. The electromagnetic wave absorber is formed into a sheet shape and attached to an inner wall surface of the housing, or is molded into a case shape and arranged inside the housing. As a constituent material of the electromagnetic wave absorber of this type, a material in which particles made of a soft magnetic material are dispersed in a matrix made of a resin material or the like is typical.

Electromagnetic wave absorption efficiency of the electromagnetic wave absorber largely depends on a specific constituent material and a thickness thereof, and a frequency of electromagnetic waves to be absorbed. Therefore, when setting the electromagnetic wave absorber in the high-frequency communication device, it is important to confirm in advance as to whether the electromagnetic wave absorber to be used can sufficiently absorb electromagnetic waves at a frequency to be absorbed and sufficiently restrain the coupling in the housing, and to design a material composition, a thickness, and the like of the electromagnetic wave absorber such that the electromagnetic waves at the frequency to be absorbed can be sufficiently absorbed. For this purpose, it is necessary to actually arrange the electromagnetic wave absorber inside the housing and evaluate the electromagnetic wave absorption efficiency. As an example of such evaluation, for example, in an example of Patent Literature 1, an electromagnetic wave absorber made of a resin composite including an iron powder, a ceramic powder, and a synthetic resin is attached to a lid of high-frequency circuit package including a package base and the lid provided on the package base, and a power transmission coefficient $S_{21}$ of the high-frequency circuit package is evaluated in a range of 0.1 GHz to 13.1 GHz.

Patent Literature 1: JP2004-143347A

SUMMARY OF THE INVENTION

As described above, for confirmation of performances of the electromagnetic wave absorber and development of a high-performance electromagnetic wave absorber, it is important to actually arrange the electromagnetic wave absorber inside the housing and evaluate the electromagnetic wave absorption efficiency. In particular, in the high-frequency region such as the millimeter waveband or the quasi-millimeter waveband, an influence caused by the coupling becomes serious, and thus there is a strong demand for reducing coupling by using an electromagnetic wave absorber having sufficiently high electromagnetic wave absorption efficiency. However, the electromagnetic waves in the millimeter waveband or the quasi-millimeter waveband are more likely to exhibit a complicated behavior in the housing due to the occurrence of random resonance at a large number of frequencies or an influence caused by a structure in the housing because of short wavelength. When an actual device such as the high-frequency circuit package used in the example of Patent Literature 1 is used, it is considered that the obtained power transmission coefficient exhibits a complicated frequency dependence. Further, as will be described below, according to the findings of the present inventor, even in the case of using a test device simpler than the actual device, the electromagnetic waves exhibit a complicated behavior depending on a design of the test device.

Figure 1:
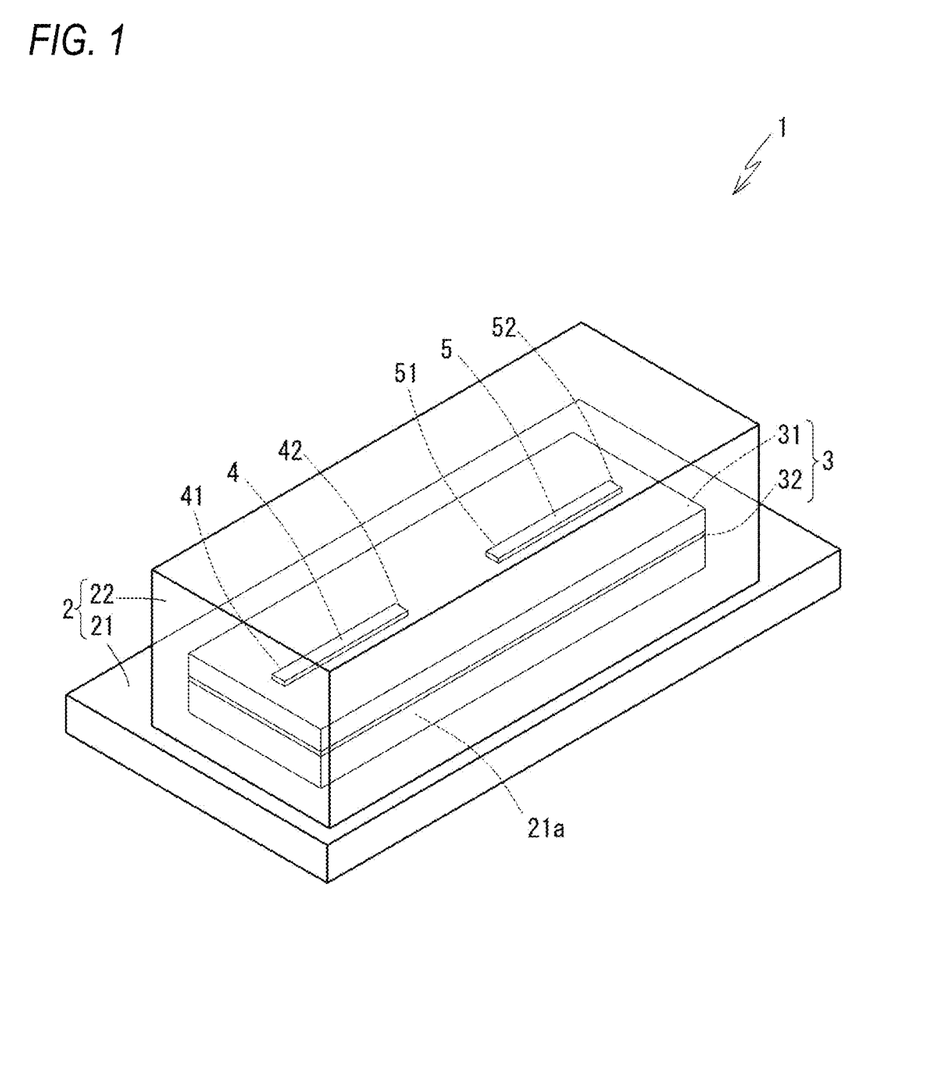
FIG. 1 is a transparent perspective view illustrating an electromagnetic wave absorber evaluation apparatus according to an embodiment of the present invention.
Figure 4A:
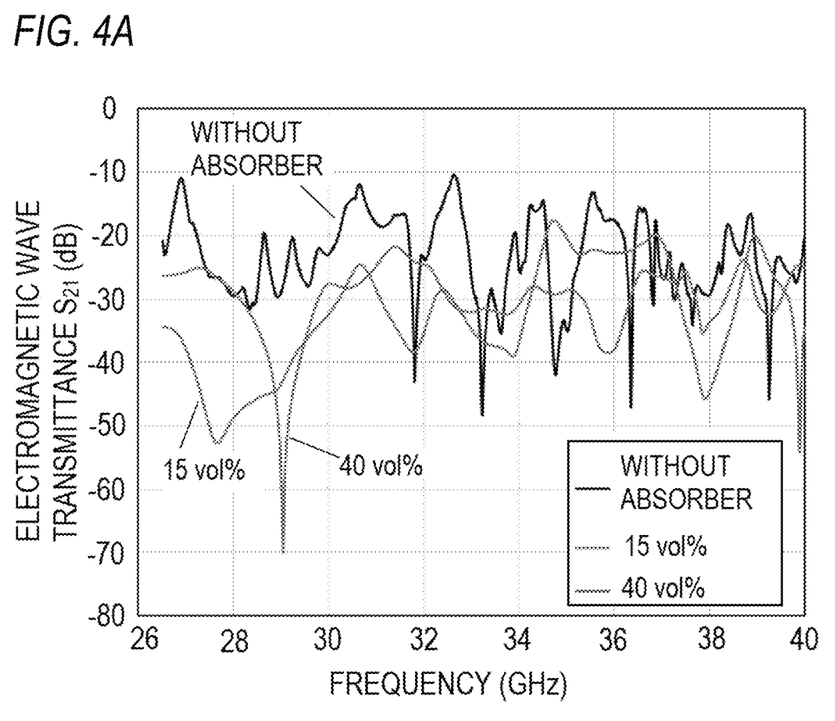
FIG. 4A and FIG. 4B are diagrams for comparing electromagnetic wave transmittances depending on the presence or absence of an electromagnetic wave absorber and a difference in the content of a soft magnetic powder in the case where a housing not satisfying Formulas (1) and (2) at 20 GHz or more is used.
Figure 4B:
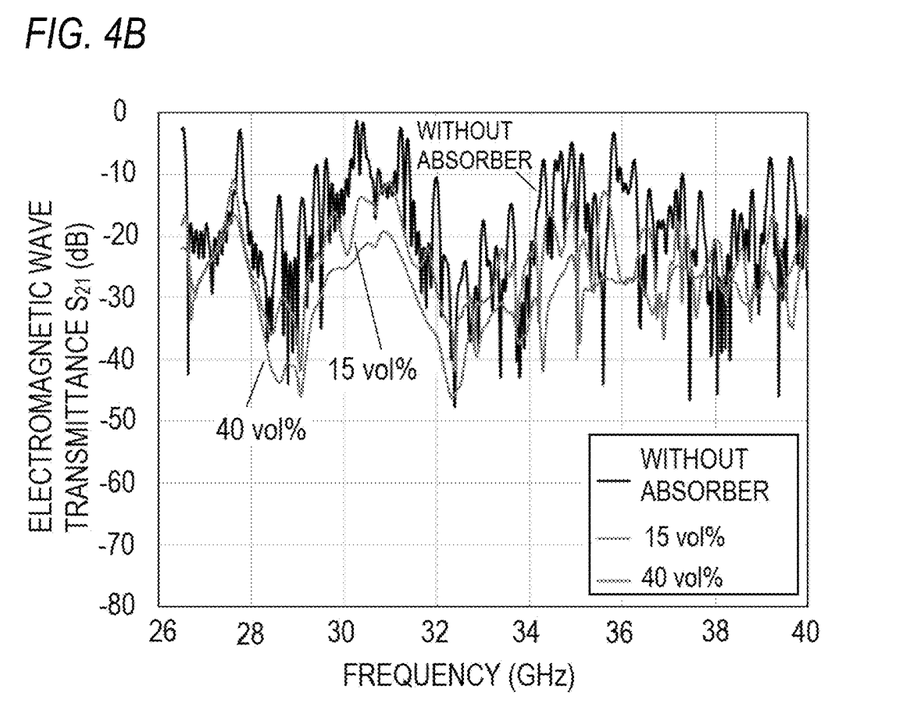

For example, as illustrated in FIG. 1, a substrate 3 on which an input microstrip line 4 and an output microstrip line 5 are formed is accommodated in a housing 2 in which a case-like electromagnetic wave absorber (not shown) is arranged, and a result obtained by inputting a signal in a millimeter wave region into the input microstrip line 4 and measuring an electromagnetic wave transmittance $S_{21}$ on the output microstrip line 5 is illustrated in FIG. 4A. Dimensions of the housing include a width a of 22.6 mm, a height b of 10.8 mm, and a length L of 63.5 mm as inner dimensions. A material obtained by dispersing a soft magnetic powder (SUS 410L) in a resin (an acrylic rubber) is used as the electromagnetic wave absorber. The measured result in the case where the electromagnetic wave absorber is not provided in the housing, the measured result in the case where the electromagnetic wave absorber in which the content of the soft magnetic powder is 15% by volume is provided, and the measured result in the case where the electromagnetic wave absorber in which the content of the soft magnetic powder is 40% by volume is provided are illustrated in FIG. 4A. In FIG. 4A, the electromagnetic wave transmittance $S_{21}$ shows complicated graph shapes that fluctuate sharply up and down. In addition, it is difficult to clearly recognize a difference in behavior exceeding the sharp vertical fluctuation among three graphs in which the presence or absence of the electromagnetic wave absorber and the content of the soft magnetic powder are different, and thus an effect of electromagnetic wave absorption by the electromagnetic wave absorber cannot be evaluated. Further, although FIG. 4B illustrates results of simulation using electromagnetic field analysis according to the finite element method, the sharp vertical fluctuation is also observed in graphs. It can be said that the complicated graph shapes of FIG. 4A obtained by an actual measurement are not caused by an accidental event such as noise during an experiment, but are caused by an essential cause such as the occurrence of resonance of electromagnetic waves at a large number of frequencies or an influence caused by a structure in the housing.

As described above, in the millimeter wave region or the quasi-millimeter wave region, even if the performances of the electromagnetic wave absorber are evaluated by an actual measurement, meaningful information may not be obtained. For example, there is a possibility that information on how much a certain electromagnetic wave absorber absorbs electromagnetic waves having a specific frequency cannot be clearly obtained. However, in the high-frequency communication device, the electromagnetic wave absorber is required to sufficiently absorb electromagnetic waves having a predetermined frequency, and in order to select and design an appropriate electromagnetic wave absorber, it is necessary to clearly know behavior of the electromagnetic wave absorber with respect to electromagnetic waves having a target frequency.

An object of the present invention is to provide an electromagnetic wave absorber evaluation apparatus and an electromagnetic wave absorber evaluation method that are capable of evaluating behavior of an electromagnetic wave absorber with respect to electromagnetic waves in a millimeter waveband or a quasi-millimeter waveband with high accuracy.

In order to solve the above problem, the electromagnetic wave absorber evaluation apparatus and the electromagnetic wave absorber evaluation method according to the present invention have the following configurations.

[1] An electromagnetic wave absorber evaluation apparatus according to the present invention is an electromagnetic wave absorber evaluation apparatus for evaluating characteristics of an electromagnetic wave absorber, the apparatus including:

a housing in which the electromagnetic wave absorber is allowed to be arranged, the housing being made of a conductive material with inner dimensions of a width a, a height b, and a length L, as b<a<L;

a substrate arranged inside the housing;

an input microstrip line and an output microstrip line formed on the substrate along a length direction of the housing and separated from each other in the length direction; and a signal inspecting unit capable of inputting an input signal having a frequency of 20 GHz or more into the input microstrip line and detecting an output signal output through the output microstrip line, in which an evaluation frequency $f_t$ obtained by the following Formula (1) satisfies the following Formula (2) in a frequency region of 20 GHz or more.

[MATH. 1]

$$f_t = \frac{1}{2\alpha}\sqrt{\left(\frac{m}{a}\right)^2 + \left(\frac{p}{L}\right)^2} \quad (1)$$

-continued $$\frac{1}{2\alpha a} \leq f_t \leq \frac{1}{2\alpha b} \quad (2)$$

Here, m and p are mutually independent and are integers of 1 or more. In addition, $\alpha$ is expressed by Formula (5) using $\mu_r$ and $\varepsilon_r$ obtained based on the following Formula (3) and Formula (4) in the case where n substances exist in a region surrounded by the housing and when setting a complex relative magnetic permeability of an i-th substance among the substances to $\mu_{ri}$, a complex relative dielectric constant thereof to $\varepsilon_{ri}$, and an area occupied by a cross section thereof orthogonal to the length direction of the housing to $S_i$. Here, $\mu_0$ is a vacuum magnetic permeability and $\varepsilon_0$ is a vacuum dielectric constant.

[MATH. 2]

$$\mu_r = \sum_{i=1}^{n} \frac{\mu_{ri} S_i}{ab} \quad (3)$$

$$\varepsilon_r = \sum_{i=1}^{n} \frac{\varepsilon_{ri} S_i}{ab} \quad (4)$$

$$\alpha = \left|\sqrt{\mu_r \mu_0 \varepsilon_r \varepsilon_0}\right| \quad (5)$$

[2] In the aspect according to [1],
in the input microstrip line and the output microstrip line, termination resistors may be respectively connected to end portions facing each other.

[3] In the aspect according to [1] or [2],
the substrate may be arranged along a bottom surface of the housing,
the electromagnetic wave absorber may be at least allowed to be arranged at a position facing the substrate along a ceiling surface of the housing, and
a distance between the substrate and the electromagnetic wave absorber arranged along the ceiling surface of the housing may be 0.01 mm or more.

[4] In the aspect according to any one of [1] to [3],
each of the input microstrip line and the output microstrip line may have a line width w, and a displacement amount between the input microstrip line and the output microstrip line along a width direction of the housing may be w/2 or less.

[5] In the aspect according to any one of [1] to [4],
a constituent material of the housing may have an electric resistivity of 150 μΩ·cm or less, and a plate thickness of a portion at least covering an upper surface and side surfaces of the substrate may be 0.01 mm or more.

[6] In the aspect according to any one of [1] to [5],
the input microstrip line and the output microstrip line may be separated from wall surfaces of the housing on both sides by b/10 or more in a width direction of the housing.

[7] In the aspect according to any one of [1] to [6],
end portions not facing each other of the input microstrip line and the output microstrip line may be separated from wall surfaces of the housing by ⅙ or more of a wavelength corresponding to the evaluation frequency $f_t$ along the length direction of the housing.

[8] An electromagnetic wave absorber evaluation method according to the present invention includes:
arranging an electromagnetic wave absorber to be evaluated inside the housing with the electromagnetic wave absorber evaluation apparatus according to any one of [1] to [7]; and evaluating characteristics of the electromagnetic wave absorber by inputting an input signal in a frequency range including the evaluation frequency $f_t$ into the input microstrip line, and detecting an output signal output through the output microstrip line.

[9] In the aspect according to [8], the electromagnetic wave absorber evaluation method may further include:

evaluating the characteristics of the electromagnetic wave absorber based on at least one of a comparison between a case where the electromagnetic wave absorber is arranged in the housing and a case where the electromagnetic wave absorber is not arranged in the housing, and a comparison between the case where the electromagnetic wave absorber is arranged in the housing and a case where a different electromagnetic wave absorber is arranged in the housing.

[10] In the aspect according to [8] or [9], the electromagnetic wave absorber may be used in a high-frequency communication device having a communication frequency of 20 GHz or more, when the communication frequency is regarded as the evaluation frequency $f_t$, dimensions of the housing may be designed to satisfy Formulas (1) and (2), and then the characteristics of the electromagnetic wave absorber may be evaluated in a frequency range including the communication frequency.

In the electromagnetic wave absorber evaluation apparatus according to the present invention that includes the configuration according to [1] described above, in the case where the input signal is input into the input microstrip line, when coupling occurs due to the propagation and resonance of electromagnetic waves in the housing, an output signal is detected on the output microstrip line. When the electromagnetic wave absorber is provided in the housing, the characteristics of the electromagnetic wave absorber such as electromagnetic wave absorption efficiency can be evaluated based on the detected output signal. Here, when the evaluation frequency $f_t$ obtained by the above Formula (1) satisfies the above Formula (2), electromagnetic waves at the evaluation frequency $f_t$ resonate in the housing. Therefore, when the characteristics of the electromagnetic wave absorber are evaluated at the evaluation frequency $f_t$, the output signal is detected with a high intensity due to the resonance. Accordingly, the characteristics of the electromagnetic wave absorber at the evaluation frequency $f_t$ such as absorption of the electromagnetic waves can be evaluated with high accuracy. Further, by satisfying Formula (2) in the frequency region of 20 GHz or more, it is possible to evaluate the characteristics of the electromagnetic wave absorber with high accuracy by using the resonance in this manner in the millimeter waveband or the quasi-millimeter waveband corresponding to the frequency region of 20 GHz or more.

That is, by appropriately designing the dimensions of the housing in accordance with Formulas (1) and (2) such that the resonance occurs at the evaluation frequency $f_t$ even in the case where the frequency for evaluating the electromagnetic wave absorber is in the millimeter wave region or the quasi-millimeter wave region, the characteristics of the electromagnetic wave absorber at the evaluation frequency $f_t$ can be evaluated with high accuracy while avoiding an influence caused by a structure in the housing and an influence caused by the resonance randomly occurring at a large number of frequencies. In addition, in the above Formulas (1) and (2), contributions of the substances existing in the housing are collectively taken in by a obtained by using the complex relative magnetic permeability $\mu_{ri}$, the complex relative dielectric constant $\varepsilon_{ri}$, and the cross-sectional area $S_i$ of each substance based on Formulas (3) to (5). Therefore, even in the case where a plurality of substances exist in the housing, a relation between the evaluation frequency $f_t$ and the dimensions of the housing in which the resonance occurs at the evaluation frequency $f_t$ can be simply and clearly defined.

In the aspect according to [2] described above, since the termination resistors are connected to the end portions facing each other of the input microstrip line and the output microstrip line, respectively, even in the case where no circuit or no element is connected between the input microstrip line and the output microstrip line, when the input signal at the evaluation frequency $f_t$ is input, the output signal due to the resonance of the electromagnetic waves in the housing can be obtained with a high intensity. Therefore, the electromagnetic wave absorber can be evaluated with high accuracy by a simple device configuration.

In the aspect according to [3] described above, the distance between the substrate and the electromagnetic wave absorber arranged along the ceiling surface of the housing may be 0.01 mm or more. In the millimeter wave region or the quasi-millimeter wave region, the height b of the housing is likely to decrease in correspondence with the short wavelength of the electromagnetic waves. However, by ensuring distances between the electromagnetic wave absorber and each of the microstrip lines formed on the substrate so as not to cause the electromagnetic wave absorber to be in contact with each of the microstrip lines in advance, it is possible to prevent an increase in an impedance of the microstrip lines due to contact with the electromagnetic wave absorber and a reduction in the output signal associated with the increase of the impedance.

In the aspect according to [4] described above, the input microstrip line and the output microstrip line may be linearly arranged within a displacement range of w/2, in the case where w indicates a line width of microstrip line. Accordingly, when the input signal at the evaluation frequency $f_t$ is input, the output signal due to the resonance of the electromagnetic waves in the housing has a high intensity, and the effect of the electromagnetic wave absorption by the electromagnetic wave absorber can be clearly evaluated. In an actual high-frequency communication device, the microstrip line has various arrangements, and the resonance of the electromagnetic waves may occur under complicated conditions. However, in the evaluation apparatus according to the present invention, the characteristics of the electromagnetic wave absorber can be purely evaluated without other factors by simplifying a phenomenon.

In the aspect according to [5] described above, the constituent material of the housing may have the electric resistivity of 150 μΩ·cm or less, and the plate thickness of the portion at least covering the upper surface and the side surfaces of the substrate may be 0.01 mm or more. That is, the housing is made of a conductive material having high conductivity and a sufficient thickness. Accordingly, external electromagnetic waves can be sufficiently blocked by the housing, and the characteristics of the electromagnetic wave absorber in the housing can be evaluated under conditions in which an influence caused by the external electromagnetic waves is reduced. Metal materials such as aluminum, copper, and brass have the electric resistivity described above, and can be suitably used for constituting the housing.

In the aspect according to [6] described above, the input microstrip line and the output microstrip line may be separated from the wall surfaces of the housing by b/10 or more in the width direction of the housing.

In the aspect according to [7] described above, the end portions not facing each other of the input microstrip line and the output microstrip line may be separated from the wall surfaces of the housing by ⅙ or more of the wavelength corresponding to the evaluation frequency $f_t$ along the length direction of the housing.

In the aspects according to [6] and [7] described above, since the microstrip lines are sufficiently separated from the wall surfaces of the housing, it is possible to highly restrain a situation where the intensity of the output signal detected by the output microstrip line is reduced when the input signal is input into the input microstrip line due to the influence caused by the wall surfaces of the housing.

In the electromagnetic wave absorber evaluation method according to the present invention that has the configuration according to [8] described above, the input signal in the frequency range including the evaluation frequency $f_t$ is input into the input microstrip line, and the output signal through the output microstrip line is detected by using the electromagnetic wave absorber evaluation apparatus described above that is provided with the housing whose dimensions are designed such that the resonance occurs at the evaluation frequency $f_t$, and thus even when the evaluation frequency $f_t$ is in the millimeter wave region or the quasi-millimeter wave region, the output signal having a high intensity can be obtained, and the characteristics of the electromagnetic wave absorber arranged in the housing can be evaluated with high accuracy while avoiding an influence caused by a structure in the housing and an influence caused by the resonance randomly occurring at a large number of frequencies. Further, by collectively taking in the contributions of the substances existing in the housing by using the α obtained based on Formulas (3) to (5), the dimensions of the housing in which the resonance occurs at the evaluation frequency $f_t$ can be set simply and clearly.

In the aspect according to [9] described above, the characteristics of the electromagnetic wave absorber may be evaluated based on at least one of the comparison between the case where the electromagnetic wave absorber is arranged in the housing and the case where the electromagnetic wave absorber is not arranged in the housing, and the comparison between the case where the electromagnetic wave absorber is arranged in the housing and the case where a different electromagnetic wave absorber is arranged in the housing. Regarding each of these situations, by comparing the behavior of the electromagnetic waves based on the output signal, it is possible to clearly evaluate the characteristics of each electromagnetic wave absorber with respect to the electromagnetic waves in the millimeter wave region or the quasi-millimeter wave region including the evaluation frequency $f_t$. The electromagnetic waves at the evaluation frequency $f_t$ resonate and provide the high-intensity output signal by appropriately setting the dimensions of the housing. Therefore, a difference in behavior of the electromagnetic waves due to a difference in the presence or absence or the type of the electromagnetic wave absorber appears largely as a change in the output signal.

In the aspect according to [10] described above, when the electromagnetic wave absorber used in the high-frequency communication device having a communication frequency of 20 GHz or more is evaluated, the dimensions of the housing are designed such that Formulas (1) and (2) are satisfied when the communication frequency is regarded as the evaluation frequency $f_t$. Then, the characteristics of the electromagnetic wave absorber are evaluated in the frequency range including the communication frequency. Therefore, the characteristics of the electromagnetic wave absorber can be evaluated with high accuracy at the communication frequency in the millimeter waveband or the quasi-millimeter waveband, which is set for the high-frequency communication device intended to apply the electromagnetic wave absorber. In the high-frequency communication device, it is necessary to effectively reduce the coupling at the communication frequency, and thus by evaluating the electromagnetic wave absorber at the communication frequency, it is possible to select and design an electromagnetic wave absorber exhibiting high characteristics at the communication frequency, and a high effect is obtained in improving communication characteristics of the high-frequency communication device.

BRIEF DESCRIPTION OF DRAWINGS

FIG. 2A to 2C are views illustrating the electromagnetic wave absorber evaluation apparatus.

FIG. 3A shows an actual measurement result, and FIG. 3B shows a simulation result;

FIG. 3A shows an actual measurement result, and FIG. 3B shows a simulation result.

DESCRIPTION OF EMBODIMENTS

Hereinafter, an electromagnetic wave absorber evaluation apparatus and an electromagnetic wave absorber evaluation method according to an embodiment of the present invention will be described with reference to the drawings. In the present embodiment, characteristics of an electromagnetic wave absorber with respect to electromagnetic waves in a millimeter wave region and a quasi-millimeter wave region are evaluated. In particular, electromagnetic wave absorption efficiency by the electromagnetic wave absorber is evaluated. Although millimeter waves have a frequency of 30 to 300 GHz, generally, waves in 28 GHz band and more are included in the millimeter waves in the high speed communication field. Further, electromagnetic waves having a frequency of about 20 to 30 GHz are referred to as quasi-millimeter waves. In the present description, electromagnetic waves having a frequency of about 20 GHz or more are considered.

[Overview of Electromagnetic Wave Absorber Evaluation Apparatus]

Figure 2A:
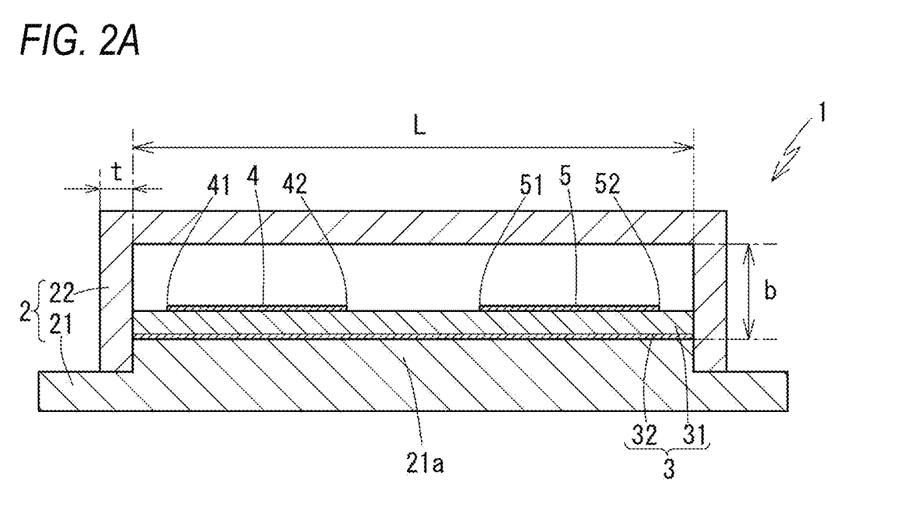
FIG. 2A is a cross-sectional view obtained by cutting a central portion in a width direction in a manner of being perpendicular to the width direction.
Figure 2B:
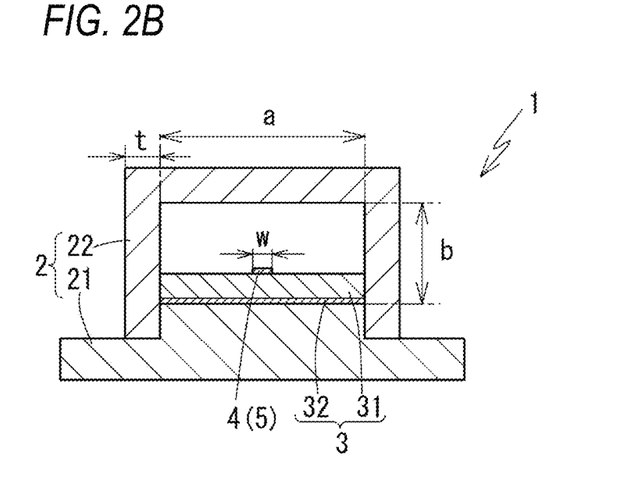
FIG. 2B is a cross-sectional view obtained by cutting at position of microstrip line in a manner of being perpendicular to a length direction.
Figure 2C:
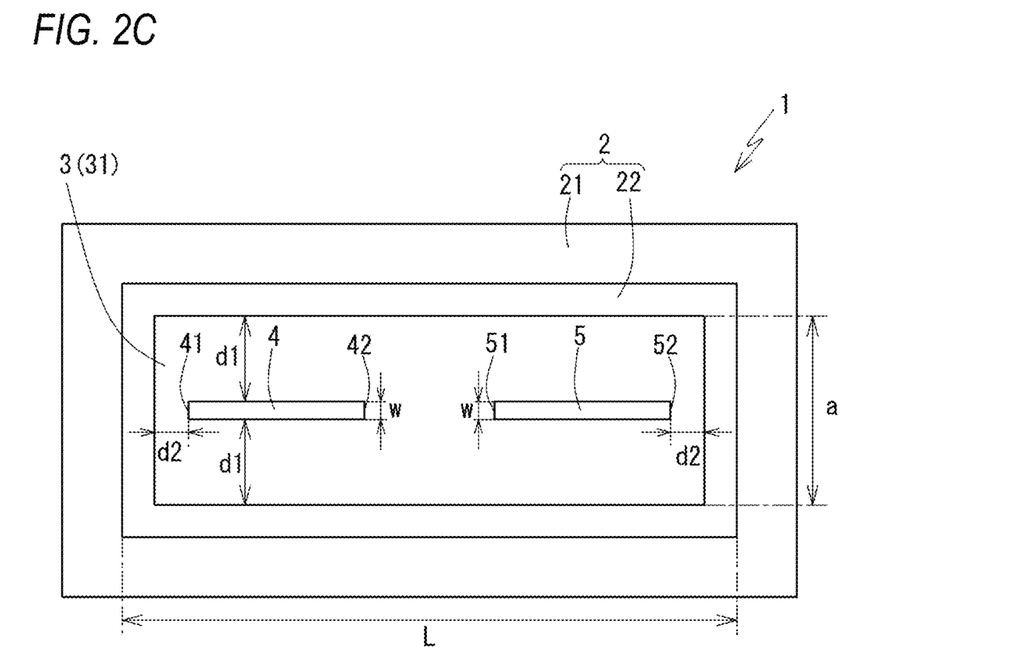
FIG. 2C is a plan view.

FIG. 1 and FIGS. 2A to 2C illustrate a schematic configuration of an electromagnetic wave absorber evaluation apparatus 1 according to one embodiment of the present invention. FIG. 1 illustrates a transparent perspective view, FIG. 2A is a cross-sectional view obtained by cutting a central portion in a width direction in a manner of being perpendicular to the width direction, FIG. 2B is a cross-sectional view obtained by cutting at position of microstrip line in a manner of being perpendicular to a length direction, and FIG. 2C is a plan view. In FIG. 2C, a ceiling surface of a housing is not shown.

The electromagnetic wave absorber evaluation apparatus (hereinafter, simply referred to as an evaluation apparatus in some cases) 1 according to the present embodiment includes a housing 2 made of a conductive material, a substrate 3 provided with microstrip lines 4, 5, and a signal inspecting unit (not shown). The housing 2 is configured as a hollow rectangular parallelepiped case member that has inner dimensions of a width a, a height b, and a length L. Here, the dimensions a, b, and L has a relation of b<a<L. The substrate 3 and the electromagnetic wave absorber (not shown) can be arranged inside the housing 2.

In the illustrated embodiment, the housing 2 is configured to be separated into a bottom plate 21 configuring a bottom surface of a rectangular parallelepiped body and an upper cover 22 configuring five surfaces other than the bottom surface of the rectangular parallelepiped body, and after the substrate 3 and the like are appropriately placed on the bottom plate 21, the upper cover 22 is placed, so that the housing 2 surrounding the substrate 3 is obtained in a rectangular parallelepiped shape. The bottom plate 21 is provided with a pedestal portion 21a at a position where the upper cover 22 is to be arranged such that a region in a shape having substantially the same inner dimensions as those of a bottom portion of the upper cover 22 protrudes upward, and the upper cover 22 can be aligned with the bottom plate 21 by covering the upper cover 22 above the pedestal portion 21a. On the bottom plate 21, an input and output unit for an electric signal or a port capable of connecting an element such as a termination resistor is provided, for example, in the form of a through hole on the microstrip lines 4, 5 provided on the substrate 3.

A material known as a substrate for forming a microstrip line can be used as the substrate 3, and the substrate 3 includes a dielectric substrate 31 and a conductor layer 32 joined to a back surface of the dielectric substrate 31. In the illustrated embodiment, a surface of the substrate 3 has substantially the same dimensions as an upper surface of the pedestal portion 21a of the housing 2 and an inner periphery of the bottom portion of the upper cover 22. The input microstrip line 4 and the output microstrip line 5 are formed on a surface of the dielectric substrate 31. Each of the input microstrip line 4 and the output microstrip line 5 is formed as a linear metal layer along a length direction of the housing 2. The input microstrip line 4 and the output microstrip line 5 are separated from each other along the length direction of the housing 2, and no circuit such as an amplifier circuit or no element is arranged between the input microstrip line 4 and the output microstrip line 5.

One end of the input microstrip line 4 serves as an input end 41, and the other end thereof serves as a terminal unit 42. Further, one end of the output microstrip line 5 serves as an output end 52, and the other end thereof serves as a terminal unit 51. The terminal unit 42 of the input microstrip line 4 and the terminal unit 51 of the output microstrip line 5 face each other on the substrate 3. From the viewpoint of improving evaluation accuracy of the evaluation apparatus 1, it is preferable that a termination resistor (not shown) is connected to each of the terminal units 42, 51. An input signal can be input to the input end 41 of the input microstrip line 4 from the signal inspecting unit. Further, an output signal output from the output end 52 of the output microstrip line 5 can be detected by the signal inspecting unit.

The signal inspecting unit is a device capable of inputting an electric signal having a frequency of 20 GHz or more as an input signal to the input microstrip line 4, and detecting an output signal output from the output microstrip line 5. A known network analyzer can be suitably used as the signal inspecting unit.

As described above, the electromagnetic wave absorber can be arranged inside the housing 2 in which the substrate 3 provided with the microstrip lines 4, 5 is arranged. The electromagnetic wave absorber is configured from, for example, a material obtained by dispersing a powder of a soft magnetic material (a soft magnetic powder) in a matrix made of an organic polymer, and can absorb and attenuate electromagnetic waves. In the present embodiment, a shape of the electromagnetic wave absorber and the arrangement of the electromagnetic wave absorber in the housing 2 are not specifically limited. For example, a sheet-like electromagnetic wave absorber can be attached to an inner side of the ceiling surface (the upper surface) of the housing 2, and an upper side of the substrate 3 can be covered by the electromagnetic wave absorber. Similarly, the sheet-like electromagnetic wave absorber may also be attached to inner sides of wall surfaces on both sides in a width direction and on both sides in the length direction of the housing. Alternatively, the electromagnetic wave absorber may be formed in a case shape that is one size smaller than the upper cover 22 of the housing 2, and then cover to surround the upper side and lateral sides of the substrate 3 in a total of five directions, and the housing 2 may be arranged to further cover the outside of the electromagnetic wave absorber having the case shape.

[Dimensions of Housing]

In the evaluation apparatus 1 according to the present embodiment, the dimensions of the housing 2, that is, the width a, the height b, and the length L (provided that b<a<L) are defined in relation to an evaluation frequency $f_t$.

Specifically, the evaluation frequency $f_t$ obtained by the following Formula (1) satisfies the following Formula (2) at a frequency of 20 GHz or more. In other words, a solution by which the evaluation frequency $f_t$ and the dimensions a, b, and L of the housing 2 satisfy the following Formulas (1) and (2) exists in a region of $f_t \geq 20$ GHz.

[MATH. 3]

$$f_t = \frac{1}{2\alpha}\sqrt{\left(\frac{m}{a}\right)^2 + \left(\frac{p}{L}\right)^2} \quad (1)$$

$$\frac{1}{2\alpha a} \leq f_t \leq \frac{1}{2\alpha b} \quad (2)$$

Here, m and p are mutually independent and are integers of 1 or more (m=1, 2, 3, and so on; p=1, 2, 3, and so on). In addition, in the case where n substances exist in a region surrounded by the housing 2, and α is expressed by Formula (5) by setting a complex relative magnetic permeability of an i-th substance among the substances to $\mu_{ri}$, a complex relative dielectric constant thereof to $\varepsilon_{ri}$, and an area occupied by a cross section thereof orthogonal to the length direction of the housing 2 to $S_i$, and using $\mu_r$ and $\varepsilon_r$ obtained based on the following Formula (3) and Formula (4). Here, $\mu_0$ is a vacuum magnetic permeability and $\varepsilon_0$ is a vacuum dielectric constant.

[MATH. 4]

$$\mu_r = \sum_{i=1}^{n} \frac{\mu_{ri} S_i}{ab} \quad (3)$$

$$\varepsilon_r = \sum_{i=1}^{n} \frac{\varepsilon_{ri} S_i}{ab} \quad (4)$$

$$\alpha = \left| \sqrt{\mu_r \mu_0 \varepsilon_r \varepsilon_0} \right| \quad (5)$$

When the characteristics of the electromagnetic wave absorber are evaluated by the evaluation apparatus 1 at the evaluation frequency $f_t$ satisfying the above Formulas (1) and (2), the resonance of the electromagnetic waves having the evaluation frequency $f_t$ occurs inside the housing 2, and coupling occurs between the input signal of the input microstrip line 4 and the output signal of the output microstrip line 5 via the electromagnetic waves. Therefore, it is possible to obtain an output signal having a high intensity as compared with the case where the resonance does not occur. Further, since the evaluation frequency $f_t$ exists in the region of 20 GHz or more, the characteristic evaluation of the electromagnetic wave absorber using such resonance can be performed in a millimeter waveband and a quasi-millimeter waveband.

The derivation of Formulas (1) and (2) based on conditions under which the resonance occurs will be described below.

When it is assumed that the inside of the housing 2 is filled with a uniform medium having a relative magnetic permeability $\mu_{r0}$ and a relative dielectric constant $\varepsilon_{r0}$, a frequency $f_0$ at which the resonance of TE waves may occur in the housing 2 is expressed by the following Formula (6).

[MATH. 5]

$$f_0 = \frac{1}{2\sqrt{\mu_{r0} \mu_0 \varepsilon_{r0} \varepsilon_0}} \sqrt{\left(\frac{m}{a}\right)^2 + \left(\frac{n}{b}\right)^2 + \left(\frac{p}{L}\right)^2} \quad (6)$$

Here, m, n and p are mutually independent and are integers of 0 or more (m=0, 1, 2, and so on; n=0, 1, 2, and so on; and p=0, 1, 2, and so on), and at least one of m, n and p is not 0.

The resonance frequency $f_0$ corresponds to the resonance in a $TE_{mnp}$ mode. That is, it is indicated that in the state where the number of peaks in an electric field distribution is m in the width direction of the housing 2, n in a height direction of the housing 2, and p in the length direction of the housing 2, the resonance occurs in the housing 2.

However, actually, the inside of the housing 2 is not filled with a uniform medium, and a plurality of substances having different magnetic permeabilities and/or dielectric constants, such as the substrate 3 and the electromagnetic wave absorber to be evaluated, are arranged in the housing 2. Therefore, a method for integrating and handling the contributions of these substances is introduced. For this purpose, a cross section orthogonal to the length direction of the housing 2 as illustrated in FIG. 2B is considered.

Here, it is assumed that n substances exist in the region surrounded by the housing 2, a complex relative magnetic permeability of the i-th substance among the n substances is $\mu_{ri}$, and a complex relative dielectric constant thereof is $\varepsilon_{ri}$. Further, an area occupied by a cross section of the i-th substance orthogonal to the length direction of the housing 2 is defined as $S_i$. A representative complex relative magnetic permeability $\mu_r$ and a representative complex relative dielectric constant $\varepsilon_r$ are calculated by using these parameters based on the following Formulas (3) and (4). The term "ab" as the denominator in Formulas (3) and (4) represents the cross-sectional area of the housing 2 orthogonal to the length direction.

[MATH. 6]

$$\mu_r = \sum_{i=1}^{n} \frac{\mu_{ri} S_i}{ab} \quad (3)$$

$$\varepsilon_r = \sum_{i=1}^{n} \frac{\varepsilon_{ri} S_i}{ab} \quad (4)$$

In a case of the cross section in FIG. 2B, air may be considered as the substance of i=1, and the dielectric substrate 31 constituting the substrate 3 may be considered as the substance of i=2. That is, in Formulas (3) and (4), the complex relative magnetic permeability and the complex relative dielectric constant of the air may be substituted as $\mu_{r1}$ and $\varepsilon_{r1}$, and an area of a region occupied by the air in the cross section of FIG. 2B may be substituted as $S_1$. In addition, the complex relative magnetic permeability and the complex relative dielectric constant of the dielectric substrate 31 may be substituted as $\mu_{r2}$ and $\varepsilon_{r2}$, and an area of a region occupied by the dielectric substrate 31 in the same cross section may be substituted as $S_2$. Further, in the case where the electromagnetic wave absorber is provided in the housing 2, the contribution of the electromagnetic wave absorber may be similarly added to Formulas (3) and (4) as the substance of i=3. The wall surfaces of the housing 2 and the conductor layer 32 of the substrate 3 are made of non-magnetic conductive materials (metal), and thus the wall surfaces of the housing 2 and the conductor layer 32 of the substrate 3 may not be considered.

In the illustrated embodiment, a state of the cross section orthogonal to the length direction is uniform over the entire region in the length direction except for a partial region in the vicinity of both ends in the length direction. Therefore, as illustrated in FIG. 2B, it is sufficient to calculate the representative complex relative magnetic permeability $\mu_r$ and the representative complex relative dielectric constant $\varepsilon_r$ in consideration of only a cross section at one position. From the viewpoint of simplification of the configuration of the evaluation apparatus 1, it is preferable to adopt a configuration in which the substances are uniformly arranged along the length direction of the housing 2 as described above. However, the arrangement of the substances in the housing 2 is not necessarily uniform along the length direction. In such a case, cross sections may be cut out at respective positions where the arrangement of the substances is different along the length direction of the housing 2, and $\mu_r$ and $\varepsilon_r$ may be calculated for each cross section based on Formulas (3) and (4). Then, the obtained values of $\mu_r$ and $\varepsilon_r$ may be added up and averaged for all the cut cross sections to obtain the final representative complex relative magnetic permeability $\mu_r$ and complex relative dielectric constant $\varepsilon_r$.

Regarding the contributions of the substances existing in the housing 2 to the propagation and resonance phenomenon of the electromagnetic waves, the uniform medium exists in the housing 2, and an approximation can be applied in which each of the substances has the representative complex relative magnetic permeability $\mu_r$ and the representative complex relative dielectric constant $\varepsilon_r$ obtained based on Formulas (3) and (4) as the complex relative magnetic permeability and the complex relative dielectric constant. The validity of this approximation is confirmed by an experiment as described in the following examples. In the case of performing such approximation, a frequency f at which the resonance of the TE waves may occur in the housing 2 is expressed by the following Formula (7) in which $\mu_{r0}$ is replaced by $\mu_r$ and $\varepsilon_{r0}$ is replaced by $\varepsilon_r$ in the above Formula (6).

[MATH. 7]
$$f = \frac{1}{2\alpha}\sqrt{\left(\frac{m}{a}\right)^2 + \left(\frac{n}{b}\right)^2 + \left(\frac{p}{L}\right)^2} \quad (7)$$

Here, $\alpha$ is defined by the following Formula (5).

[MATH. 8]
$$\alpha = |\sqrt{\mu_r \mu_0 \varepsilon_r \varepsilon_0}| \quad (5)$$

In Formula (7), it is assumed that n=0, m≠0, and p≠0, and the following Formula (1) is obtained.

[MATH. 9]
$$f_t = \frac{1}{2\alpha}\sqrt{\left(\frac{m}{a}\right)^2 + \left(\frac{p}{L}\right)^2} \quad (1)$$

The frequency calculated based on Formula (1) indicates a resonance frequency at which the resonance in a $T_{m0p}$ mode occurs, and in the resonance, no peaks exist in the electric field distribution in the height direction (a direction of b). According to Formula (1), by matching the evaluation frequency $f_t$ at which the electromagnetic wave absorber is to be evaluated with the resonance frequency, it is possible to evaluate the characteristics of the electromagnetic wave absorber under conditions in which the resonance occurs and an output signal having a high intensity is obtained. Here, the reason why n=0 is because the TE waves are excluded from the consideration since the TE waves have peaks in the height direction of the housing 2, the TE waves have a very short wavelength and are likely to have an excessively high frequency, and further a large number of resonance peaks appear at nearby frequencies, which complicates analysis.

Further, in the present embodiment, the evaluation frequency $f_t$ obtained based on Formula (1) falls between a lowest frequency $f_{min}$ and a highest frequency $f_{max}$ as in the following Formula (8).

[MATH. 10]
$$f_{min} \leq f_t \leq f_{max} \quad (8)$$

The $f_{min}$ and the $f_{max}$ are defined as in the following Formulas (9a) and (9b), respectively.

[MATH. 11]
$$f_{min} = \frac{1}{2\alpha a} \quad (9a)$$
$$f_{max} = \frac{1}{2\alpha b} \quad (9b)$$

The $f_{min}$ in Formula (9a) is obtained by setting m=1 and n=p=0 in the general formula of the resonance frequency in Formula (7). That is, the $f_{min}$ corresponds to a $TE_{100}$ mode. In addition, the $f_{max}$ in Formula (9b) is obtained by setting n=1 and m=p=0 in the general formula of the resonance frequency in Formula (7). That is, the $f_{max}$ corresponds to a $TE_{010}$ mode. The two modes corresponding to the lowest frequency $f_{min}$ and the highest frequency $f_{max}$ are lowest order modes of the resonance of the TE waves, and have high Poynting energy. By setting the evaluation frequency $f_t$ to fall between the lowest frequency $f_{min}$ and the highest frequency $f_{max}$ in advance as in Formula (8), the high Poynting energy is easily obtained even in a resonance mode of the evaluation frequency $f_t$.

The following Formula (2) is obtained by using the above Formula (8) and Formulas (9a) and (9b).

[MATH. 12]
$$\frac{1}{2\alpha a} \leq f_t \leq \frac{1}{2\alpha b} \quad (2)$$

In Formula (1) for determining the evaluation frequency $f_t$, m≥1 and p≥1, and thus the inequality sign on the left side of Formula (2) is always satisfied.

As described above, when Formula (1) is satisfied, the resonance occurs at a desired evaluation frequency $f_t$ at which the characteristics of the electromagnetic wave absorber are to be evaluated, and when Formula (2) is satisfied, the resonance occurs with a high intensity at the evaluation frequency $f_t$. That is, in the case where the housing 2 of the evaluation apparatus 1 is designed such that the width a, the height b, and the length L satisfy the Formulas (1) and (2) in relation to the evaluation frequency $f_t$, when an input signal at the evaluation frequency $f_t$ is input into the input microstrip line 4, an output signal having a high intensity is obtained from the output microstrip line 5. Therefore, it is possible to restrain phenomena such as an influence caused by a structure (excluding the dielectric substrate 31 and the electromagnetic wave absorber) existing in the housing 2, high-order resonance which randomly occurs at short frequency intervals, and an influence caused by external noise, and to evaluate the characteristics of the electromagnetic wave absorber at the evaluation frequency $f_t$ with high accuracy. Since the millimeter waves and the quasi-millimeter waves are short in wavelength, if the dimensions of the housing 2 do not satisfy Formulas (1) and (2), an influence caused by the phenomena becomes large, and there is a possibility that the characteristics of the electromagnetic wave absorber cannot be evaluated at the desired evaluation frequency $f_t$ with sufficient accuracy.

Further, in the present embodiment, the evaluation frequency $f_t$ and the dimensions a, b, and L of the housing 2 are set such that the evaluation frequency $f_t$ satisfying Formulas (1) and (2) exists in a frequency region of 20 GHz or more. Accordingly, the evaluation of the characteristics of the electromagnetic wave absorber with respect to the electromagnetic waves in the millimeter wave region and the quasi-millimeter wave region having a frequency of 20 GHz or more can be performed with high accuracy by using the resonance of the electromagnetic waves in the evaluation apparatus 1. As long as one or more evaluation frequencies $f_t$ satisfying Formulas (1) and (2) exist in a region of 20 GHz or more, the specific magnitude of the evaluation frequency $f_t$ and the number of the evaluation frequencies $f_t$ are not particularly limited. However, from the viewpoint of evaluating the electromagnetic wave absorber with high accuracy in a relatively high frequency region in the millimeter wave region and the quasi-millimeter wave region, it is preferable that one or more evaluation frequencies $f_r$ satisfying Formulas (1) and (2) exist in a region of 23 GHz or more, and further a region of 26 GHz or more. In addition, regarding a frequency near 28 GHz which is currently mainly used for communication in the millimeter waveband, from the viewpoint of allowing the electromagnetic wave absorber to be evaluated with high accuracy, it is preferable that at least one of the evaluation frequencies $f_r$ satisfying Formulas (1) and (2) exists in a range of 26 GHz or more and further 30 GHz or less. In the case of considering further increase of the communication frequency, it is preferable that a solution of the evaluation frequency $f_r$ satisfying Formulas (1) and (2) also exists in a region of more than 30 GHz, a region of 50 GHz or more, and further a region of 80 GHz or more. In addition, from the viewpoint of being capable of using the resonance in an evaluation test in a wide frequency range, it is preferable that the number of evaluation frequencies $f_r$ satisfying Formulas (1) and (2) is two or more, five or more, and further ten or more. However, when many resonances occur at nearby frequencies, analysis in the evaluation of the electromagnetic wave absorber becomes complicated, and thus the number of evaluation frequencies $f_r$ per 10 GHz in the frequency range may be five or less.

Further, although the plurality of substances exist in the housing 2 of the evaluation apparatus 1, in Formulas (1) and (2), the single a defined by Formulas (3) to (5) is used as a representative value, and the contributions of the magnetic permeabilities and the dielectric constants of the plurality of substances are taken in. As described above, since Formulas (1) and (2) are formulated in a simple form by using the representative value a obtained approximately, the dimensions of the housing 2 can be easily and clearly set in relation to the evaluation frequency $f_r$.

[Various Parameters in Configuration of Electromagnetic Wave Absorber Evaluation Apparatus]

As described above, in the evaluation apparatus 1 according to the embodiment of the present invention, as long as the width a, the height b, and the length L of the housing 2 are determined to satisfy the above Formulas (1) and (2) at 20 GHz or more in relation to the evaluation frequency $f_r$, detailed dimensions and shapes are not particularly limited. However, it is preferable to include the parameters described below from the viewpoint of reducing an unnecessary influence caused by the structure in the housing 2 and the influence caused by external noise, and increasing the accuracy of the evaluation of the electromagnetic wave absorber.

First, the width a, the height b, and the length L of the housing 2 are not particularly limited as long as the above Formulas (1) and (2) are satisfied in a range of 20 GHz or more at the evaluation frequency $f_r$ freely set in the millimeter wave region or the quasi-millimeter wave region. However, when assuming that the evaluation frequency $f_r$ is set in the 28 GHz band which is often used for communication in the millimeter wave region, the width a, the height b, and the length L can be suitably set in the ranges described below, respectively. In particular, in the case where a lowest measurement frequency is 26 GHz or more and a highest measurement frequency is 30 GHz or less, the following ranges can be suitably applied. ■5 mm≤a≤13 mm■4 mm≤b≤30 mm■40 mm≤L≤56 mm Here, regarding the height b and the length L, the above ranges are preferable from the viewpoint of workability of preparation and measurement of the evaluation apparatus 1. Regarding the width a, in the case where the height b and the length L are within the above ranges, the above range is set such that the above Formulas (1) and (2) are easily satisfied in the frequency region of 20 GHz or more.

In addition, the length L can be suitably set in a range of 3 times or more and 11 times or less with respect to the width a.

In the housing 2, in the case where the electromagnetic wave absorber is at least arranged at a position along the ceiling surface of the housing 2, it is preferable that the electromagnetic wave absorber arranged along the ceiling surface and the substrate 3 arranged along the bottom surface (the bottom plate 21) of the housing 2 do not come into contact with each other and a distance therebetween is ensured. Further, the distance is preferably 0.01 mm or more. In the millimeter wave region and the quasi-millimeter wave region, the height b of the housing 2 is easily reduced in accordance with the short wavelength of the electromagnetic waves. However, by ensuring the distance between the electromagnetic wave absorber and the substrate 3 such that the electromagnetic wave absorber does not come into contact with the microstrip lines 4, 5, it is possible to prevent an increase in an impedance of the microstrip lines 4, 5 due to contact with the electromagnetic wave absorber and a reduction in the output signal associated with the increase of the impedance, and to accurately evaluate the characteristics of the electromagnetic wave absorber using the coupling between the microstrip lines 4, 5.

In addition, the input microstrip line 4 and the output microstrip line 5 are preferably arranged on a straight line along the length direction of the housing 2 with as small an error as possible. For example, in the case where the line width (the width of each of the microstrip lines 4, 5) is set to w, the input microstrip line 4 and the output microstrip line 5 may be arranged on the straight line within a displacement range of w/2 in the width direction of the housing 2. In the case where the input microstrip line 4 and the output microstrip line 5 are arranged on the straight line, the resonance at the evaluation frequency $f_r$ becomes strong, and the output signal is easily obtained with a high intensity. In addition, since the structure in the housing 2 is close to an ideal model used for deriving Formulas (1) and (2), the conditions under which the resonance occurs is close to theoretical values expressed by the Formulas (1) and (2). Therefore, the characteristics of the electromagnetic wave absorber at the evaluation frequency $f_r$ are likely to be purely evaluated by eliminating an influence caused by other factors. In an actual high-frequency communication device, the microstrip line has various arrangements, and the resonance of the electromagnetic waves may occur under complicated conditions. However, in the evaluation apparatus 1, it is possible to obtain findings related to the characteristics of the electromagnetic wave absorber under simplified conditions. The electromagnetic wave absorber may be applied to various high-frequency communication devices based on the findings. In addition, the line width w may be determined such that a characteristic impedance Zo calculated based on the following Formula (10) is equal to a characteristic impedance (typically 50Ω) of an input and output unit of the signal inspecting unit.

[MATH. 13]

$$Z_0[\Omega] = \frac{87}{\sqrt{\varepsilon_r + 1.41}} \log_e\left(\frac{5.98H}{0.8w + T}\right) \tag{10}$$

The input microstrip line 4 and the output microstrip line 5 are preferably separated by b/10 or more from the wall surfaces on both sides in the width direction of the housing 2 (d1≥b/10). In addition, the microstrip lines 4, 5 are preferably arranged at a central position (a position of b/2) along the width direction of the housing 2, and for example, an error from the central position in the width direction is preferably within a range of ±b/10. In the length direction of the housing 2, each the input end 41 of the input microstrip line 4 and the output end 52 of the output microstrip line 5 is preferably separated from the wall surface in the length direction of the housing 2 by ⅙ or more of a wavelength λ corresponding to the evaluation frequency $f_t$ (a wavelength in a space inside the housing 2, that is, $1/(f_t \alpha)$) (d2≥λ/6). In these cases, the microstrip lines 4, 5 are arranged at positions sufficiently separated from the wall surfaces on both sides in the width direction and both sides in the length direction, and the electromagnetic waves contributing to the coupling between the microstrip lines 4, 5 are less likely to be affected by the wall surfaces of the housing 2. Therefore, a change in the output signal due to the influence caused by the wall surfaces hardly occurs, and the accuracy of the evaluation for the electromagnetic wave absorber can be improved.

The constituent material of the housing 2 is not particularly limited as long as the constituent material is a conductive material, particularly a non-magnetic metal. However, the constituent material of the housing 2 preferably has an electric resistivity of 150 μΩ·cm or less, and more preferably 100 μΩ·cm or less. In addition, it is preferable that a plate thickness of a portion covering the upper surface and the side surfaces of the substrate 3, that is, a plate thickness t of each surface of the upper cover 22 is 0.01 mm or more. More preferably, the pedestal portion 21a of the bottom plate 21 may have a plate thickness of 0.01 mm or more. In this way, in the case where the housing 2 is made of a conductive material having high conductivity and sufficient thickness, the housing 2 can sufficiently block external electromagnetic waves. Accordingly, the characteristics of the electromagnetic wave absorber in the housing 2 can be evaluated under conditions in which an influence caused by the external electromagnetic waves is sufficiently reduced. Metal materials such as aluminum, copper, and brass (brass foil) have an electric resistivity in the above range. These materials may be appropriately plated with other metals.

[Electromagnetic Wave Absorber Evaluation Method]

Next, an electromagnetic wave absorber evaluation method according to one embodiment of the present invention will be described. In the evaluation method according to the present embodiment, the characteristics of the electromagnetic wave absorber are evaluated by using the electromagnetic wave absorber evaluation apparatus 1 according to the embodiment of the present invention described above.

During the evaluation, an electric signal in a frequency range including the evaluation frequency $f_t$ is input into the input end 41 of the input microstrip line 4 in a state where the electromagnetic wave absorber to be appropriately inspected is arranged inside the housing 2 of the evaluation apparatus 1. Then, an output signal output from the output end 52 of the output microstrip line 5 is detected. The characteristics of the electromagnetic wave absorber can be evaluated based on the behavior of the output signal. For example, regarding a specific frequency, the electromagnetic wave absorption efficiency of the electromagnetic wave absorber at the frequency can be evaluated by evaluating an electromagnetic wave transmittance $S_{21}$. It is indicated that the electromagnetic wave absorption efficiency becomes high, and the efficiency of decoupling also becomes high as the electromagnetic wave transmittance $S_{21}$ becomes lower. Here, the electromagnetic wave transmittance $S_{21}$ is obtained as $S_{21}$ [dB]=20 log ($V_2/V_1$) by setting a voltage of the input signal to $V_1$ and setting a voltage of the output signal to $V_2$. In the evaluation apparatus 1, the dimensions of the housing 2 are set based on the above Formulas (1) and (2) such that the resonance of the electromagnetic waves occurs at the evaluation frequency $f_t$ of 20 GHz or more, and thus the output signal having a high intensity can be obtained by the coupling between the input signal and the output signal, and the electromagnetic wave absorber at the evaluation frequency $f_t$ can be evaluated with high accuracy.

During the evaluation of the electromagnetic wave absorber, from the viewpoint of clarifying a difference in behavior with respect to the electromagnetic waves depending on the presence or absence of the electromagnetic wave absorber, compositions, a thickness, and the like of the electromagnetic wave absorber, the above evaluation is performed for both of the case where the electromagnetic wave absorber is arranged and the case where the electromagnetic wave absorber is not arranged in the housing 2, and/or for a plurality of cases where electromagnetic wave absorbers mutually different in compositions, a thickness, and the like are disposed, and results obtained in these cases are preferably compared with each other. In this way, it is possible to select an electromagnetic wave absorber that has desired characteristics such as high electromagnetic wave absorption efficiency at the predetermined evaluation frequency $f_t$. In addition, an evaluation result is easily used as basic information for designing and developing such a suitable electromagnetic wave absorber.

When the presence or absence or the type of the electromagnetic wave absorber is changed as described above, values of the representative complex relative magnetic permeability $\mu_r$ and the representative complex relative dielectric constant $\varepsilon_r$ obtained based on Formulas (3), (4) are changed, and there is a possibility that the frequency at which the resonance occurs in correspondence with the designed dimensions a, b, and L of the housing 2, that is, the resonance frequency represented by Formula (7) is changed. Also in this case, in order to evaluate the characteristics of the electromagnetic wave absorber under the conditions in which the resonance occurs, the frequency at which the evaluation is performed may be set in a wide range including the evaluation frequency $f_t$ used to determine the dimensions of the housing 2. As a specific method for determining the dimensions of the housing 2, for example, in the state where the electromagnetic wave absorber is not arranged in the housing 2, $\mu_r$ and $\varepsilon_r$ may be calculated based on Formulas (3) and (4), and the dimensions a, b, and L of the housing 2 may be determined such that Formulas (1) and (2) are satisfied at the desired evaluation frequency $f_t$ set to 20 GHz or more by using the values of r and F. Alternatively, as performed in the examples described below, in the case where the dimensions of the housing 2 are set in advance for convenience in manufacturing of the housing 2, restrictions on the constituent material to be used, and the like, when the evaluation frequency $f_t$ calculated by substituting the set dimensions a, b, and L into Formulas (1) and (2) is 20 GHz or more and exists in a frequency range acceptable as an evaluation target, it may be determined that the housing 2 can be used for the evaluation. In either case, in a measurement frequency range set to include the evaluation frequency $f_t$ satisfying Formulas (1) and (2) and to be sufficiently wide, the evaluation based on the input of the input signal and the detection of the output signal may be performed while changing the presence or absence and/or the type of the electromagnetic wave absorber. Preferably, in the state where the electromagnetic wave absorbers to be evaluated are arranged, it may be confirmed in advance that the resonance frequency at which Formulas (1) and (2) are satisfied is included in the measurement frequency range. The lowest frequency $f_{min}$ and the highest frequency $f_{max}$ set based on Formulas (9a) and (9b) may merely represent frequencies of two lowest order resonance modes in the housing 2, and a lower limit and an upper limit of an actual measurement frequency range may not coincide with the $f_{min}$ and the $f_{max}$. However, the upper limit of the measurement frequency range is preferably set to the $f_{max}$ or more in advance.

When it is considered that the electromagnetic wave absorber whose characteristics are evaluated by the evaluation method according to the present embodiment, or in which the compositions, the thickness, and the like are designed based on the evaluation result thereof is applied to the actual high-frequency communication device, in order to sufficiently reduce the coupling in a device housing of the high-frequency communication device by the electromagnetic wave absorber, it is necessary to absorb electromagnetic waves having a communication frequency uniquely set for the high-frequency communication device with high efficiency by the electromagnetic wave absorber. In this case, during the execution of the evaluation method according to the present embodiment, when the communication frequency of the high-frequency communication device, which is set to 20 GHz or more, is regarded as the evaluation frequency $f_t$, the dimensions a, b, and L of the housing 2 may be set to satisfy the above Formulas (1) and (2). Then, the evaluation of the electromagnetic wave absorber using the housing 2 may be performed in the frequency range including the communication frequency. Therefore, the characteristics of the electromagnetic wave absorber are evaluated under conditions in which the resonance occurs at an actual communication frequency, and the characteristics of the electromagnetic wave absorber at the communication frequency can be evaluated with high accuracy. By using the obtained evaluation result, it is possible to select and design an electromagnetic wave absorber that exhibits excellent characteristics in the actual high-frequency communication device.

As described above, the method for evaluating the characteristics of the electromagnetic wave absorber after designing the dimensions of the housing 2 of the evaluation apparatus based on the conditions in which the resonance occurs at the desired evaluation frequency $f_t$ can be applied not only to an actual measurement but also to a simulation. For example, a simulation incorporating the housing 2 designed based on Formulas (1) and (2) into a model and using electromagnetic field analysis according to the finite element method may be performed. When studies on the configuration of the electromagnetic wave absorber are performed by using both the actual measurement and the simulation, there is a possibility that the findings relating to the characteristics of the electromagnetic wave absorber can be further deepened as compared with the case where only the actual measurement is used, for example, the electromagnetic wave absorber can be designed and developed systematically.

Examples

Hereinafter, the present invention will be described more specifically with reference to Examples. The present invention is not limited by the following examples.

[1] First, the validity of the relation represented by the above Formulas (1) to (5) between the dimensions of the housing and the resonance frequency was verified.

[Evaluation Method]<Preparation of Evaluation Apparatus>

An evaluation apparatus having the structure in FIGS. 1 to 2C was produced. Here, parameters related to the structure of the evaluation apparatus were as follows.

Housing
    width a: 11 mm
    height b: 4.5 mm
    length L: 55 mm
    material of upper cover: gold-plated brass plate having a thickness of 3 mm
    microstrip line
    line width w: 0.76 mm
    length: 17 mm on each of input and output sides
    separation distance between lines on input and output sides: 13 mm
    position in width direction: an error range of ±0.05 mm or less with respect to the central position in the width direction of the housing on both the input side and the output side
    distances (d2) from the wall surfaces on both sides in the length direction to the input and output ends: 4 mm <Actual Measurement of Electromagnetic Wave Transmittance>

The electromagnetic wave transmittance $S_{21}$ was measured by using the above evaluation apparatus. The measurement was performed by detecting an output from the output microstrip line while inputting an electric signal in a range of 26 GHz to 40 GHz into the input microstrip line by using the network analyzer. The measurement was performed in two cases, that is, the case where the electromagnetic wave absorber is not provided in the housing and the case where the electromagnetic wave absorber molded to the case shape is arranged inside the housing. As the constituent material of the electromagnetic wave absorber, a material obtained by dispersing a soft magnetic powder made of SUS 410L in the content of 40% by volume in an acrylic rubber as a matrix resin followed by molding to have a thickness of 0.8 mm was used.

<Execution of Simulation>

The same evaluation test as that in the actual measurement described above was reproduced by the simulation to estimate the electromagnetic wave transmittance $S_{21}$. Here, the simulation was executed for the case where the electromagnetic wave absorber was not provided in the housing, the case where the case-like electromagnetic wave absorber was provided in the housing as in the actual measurement test described above, and further a case where a case-like resin molded body having the same shape as that of the electromagnetic wave absorber was formed of only a matrix resin not mixed with a soft magnetic powder and was disposed in the housing. The simulation was executed by the electromagnetic field analysis according to the finite element method. Here, the frequency range was set to 26 GHz to 30 GHz.

<Calculation of Resonance Frequency>

Regarding the evaluation apparatus, a value of the α was estimated by a calculation using Formulas (3) to (5). At this time, the following substances were taken into consideration as the substances in the housing.

Air (i=1)
    $\mu_{r1}=1$
    $\varepsilon_{r1}=1$
    $S_i=37.906$ mm$^2$ Dielectric substrate (i=2)
$\mu_{r2}=1$
$\varepsilon_{r2}=2.2$
$S_2=2.794$ mm$^2$
  Electromagnetic wave absorber (i=3)
$\mu_{r3}=18.7-0.6j$
$\varepsilon_{r3}=0.5-0.4j$
(j represents an imaginary unit)
$S_3=8.800$ mm$^2$
  The following values were used as physical constants.
  vacuum magnetic permeability $\mu_0=4\pi/10^7$ [N·A$^{-2}$]
  vacuum dielectric constant $\varepsilon_0=10^7/(4\pi c^2)$ [F·m$^{-1}$]
  speed of light c=299792458 [m/s]
  The value of the α obtained by using the above parameters was 3.34×10$^{-9}$ [s/m].

When the lowest frequency $f_{min}$ and the highest frequency $f_{max}$ were calculated based on Formulas (9a) and (9b) by using the above-obtained a, the following results were obtained. The range defined by the $f_{min}$ and the $f_{max}$ partially overlaps the range of 26 GHz to 40 GHz applied in the actual measurement.
  $f_{min}$=13.63 GHz
  $f_{max}$=33.31 GHz Next, the values of the above a, b, L, and the α were substituted into Formula (1) to calculate the value of the evaluation frequency $f_t$. At this time, a larger number of evaluation frequencies $f_t$ are obtained by the combination of m and p, and among the evaluation frequencies, the evaluation frequency existing in the frequency range between the lowest frequency $f_{min}$ and the highest frequency $f_{max}$ are recorded.

[Evaluation Result]

Figure 3A:
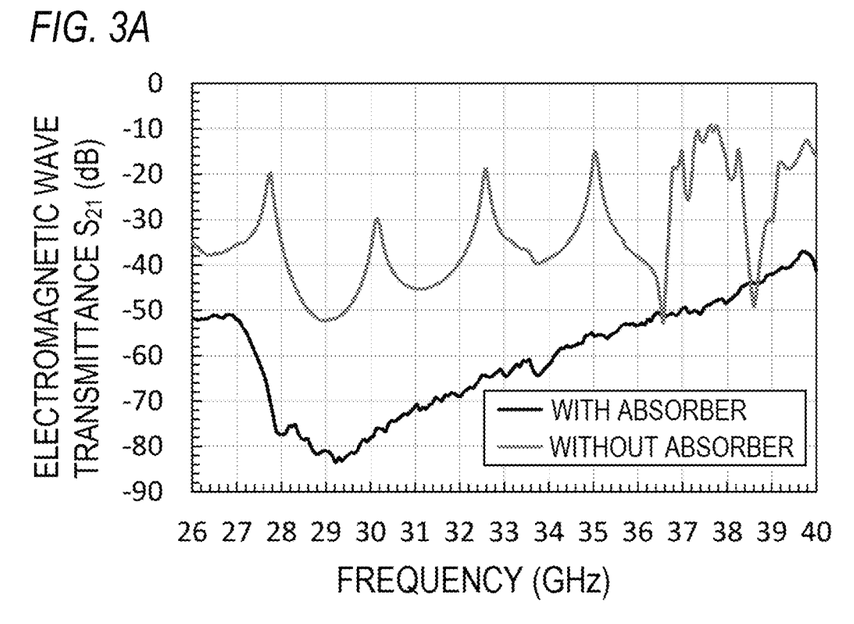
FIG. 3A and FIG. 3B are diagrams for comparing electromagnetic wave transmittances depending on the presence or absence of an electromagnetic wave absorber in the case where a housing satisfying Formulas (1) and (2) at 20 GHz or more is used.

FIG. 3A shows a measurement result of the electromagnetic wave transmittance obtained by the actual measurement. In a spectrum of the case where the electromagnetic wave absorber is not arranged, four sharp peak structures are observed in a range of about 27 GHz to 36 GHz. These peaks are considered to be caused due to the resonance of the electromagnetic waves.

The following Table 1 shows a frequency of each peak top among the peaks obtained by actual measurement. In addition, among calculated values of the resonance frequency (the evaluation frequency $f_t$) calculated by substituting the a, b, L, and α into Formula (1), a main value in the region of 20 GHz or more is shown together with a mode type ($T_{m0p}$). In the table, the values indicating nearby frequencies obtained by the actual measurement and the calculation are displayed with aligned rows.

resonance peaks in a plurality of modes obtained by the calculation overlap each other, and one resonance peak appear in the actual measurement. The results of Table 1 indicate that the resonance frequency of the actual measurement is well matched with that of the calculation. That is, in the calculation of the resonance frequency, an approximate process is introduced in which the α, which is a representative value obtained by integrating the contributions of a plurality of materials into one contribution based on Formulas (3) to (5), and since the calculation of resonance frequency is well matched with a resonance frequency of an actual measurement value, it is confirmed that this process is appropriate. In addition, it can be said that a method of defining, by using Formulas (1) to (5), a relation between the evaluation frequency $f_t$ and the dimensions a, b, and L of the housing such that the resonance occurs in the desired frequency range is effective in view of an actual measurement result.

Further, in a spectrum of the case where the electromagnetic wave absorber is not arranged in FIG. 3A, as described above, four clear peaks that can be interpreted to be derived from the resonance of the electromagnetic waves are observed in a frequency region of about 36 GHz or less, whereas the value of the electromagnetic wave transmittance sharply fluctuates up and down on a side of a frequency higher than 36 GHz, and a clear peak structure is hardly confirmed. A region on this high frequency side corresponds to a frequency region of the $f_{max}$ (33.31 GHz) or more. In the frequency region of the $f_{max}$ or more corresponding to the $TE_{010}$ mode, the high-order resonance randomly occurs with a low intensity and at small frequency intervals, and thus it is interpreted that the sharp vertical fluctuation is observed in the value of the electromagnetic wave transmittance. Accordingly, the validity of determining the upper limit of the evaluation frequency $f_t$ to be less than the $f_{max}$ as in Formula (2) is supported.

Next, when the measurement result of the case where the electromagnetic wave absorber was arranged in the housing is seen in FIG. 3A, in the entire frequency region of 36 GHz or less, the electromagnetic wave transmittance is lower than that of the case where the electromagnetic wave absorber was not arranged, and all the sharp peaks caused by the resonance, which occurred in the case where the electromagnetic wave absorber was not arranged, disappear. This is interpreted to be because the electromagnetic waves propagating in the housing are absorbed and attenuated by the electromagnetic wave absorber, and the coupling between the input signal of the input microstrip line and the output signal of the output microstrip line is reduced. As described

TABLE 1

| Actual Measurement Result | | Calculation Result | | | | |
|---|---|---|---|---|---|---|
| Peak Number | Peak Frequency (GHz) | Resonance Mode | Resonance Frequency (GHz) | Resonance Mode | Resonance Frequency (GHz) | Resonance Mode | Resonance Frequency (GHz) |
| #1 | 27.68 | $TE_{201}$ | 27.39 | $TE_{202}$ | 27.79 | $TE_{203}$ | 28.45 |
| #2 | 30.20 | $TE_{204}$ | 29.35 | $TE_{205}$ | 30.47 | — | — |
| #3 | 32.65 | $TE_{1011}$ | 32.93 | — | | — | |
| #4 | 35.10 | $TE_{1012}$ | 35.43 | — | | — | |

According to Table 1, regarding each of peaks #1 to #4 observed in the actual measurement, a resonance frequency according to the calculation appears at a nearby frequency. Regarding the peak #1 and the peak #2, it is considered that above, by measuring and comparing the electromagnetic wave transmittances in the case where the electromagnetic wave absorber is provided in the housing and the case where the electromagnetic wave absorber is not provided in the housing in a range including a frequency at which the resonance of the electromagnetic waves occurs in the housing and a high electromagnetic wave transmittance is provided, an effect of the electromagnetic wave absorption achieved by arranging the electromagnetic wave absorber can be clearly confirmed.

Figure 3B:
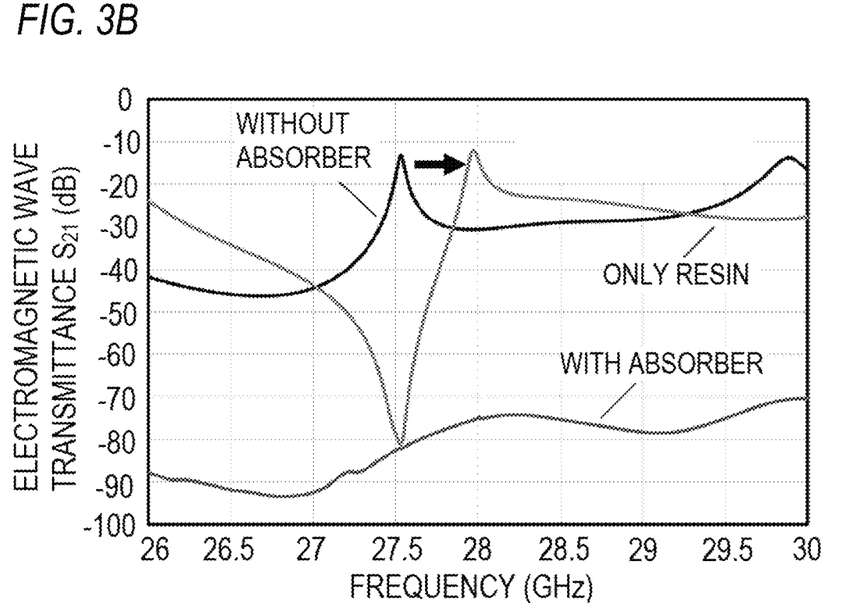

Further, when the result of the simulation is seen in FIG. 3B, in the case where the electromagnetic wave absorber was not provided, peaks appear near 27.5 GHz and near 29.8 GHz. These frequencies well correspond to the peak #1 and the peak #2 in Table 1. That is, it is confirmed that there is high consistency among the actual measurement, the simulation, and the calculation based on Formula (1) in relation to the resonance frequency. Further, in the case where the electromagnetic wave absorber was provided, an electromagnetic wave absorption rate greatly decreases, and the two peaks disappear. This result also matches with that of the actual measurement. On the other hand, in the case where a case made of only a resin was provided, only the position of the resonance peak is moved as indicated by an arrow in FIG. 3B, and the attenuation of the resonance does not occur.

According to the above test, the validity of using the α obtained based on Formulas (3) to (5) as a parameter representing the contribution of the substance in the housing with respect to the resonance phenomenon of the electromagnetic waves in the housing was confirmed. In addition, it was shown that by applying the housing that has the dimensions satisfying Formulas (1) and (2) incorporating the α in relation to the evaluation frequency $f_r$, the output signal can be obtained with a high intensity by using the resonance in both the actual measurement and the simulation, and thus the characteristics of the electromagnetic wave absorber can be evaluated with high accuracy.

[2] The electromagnetic wave transmittance was evaluated by the actual measurement and the simulation even in a case where the dimensions of the housing do not satisfy Formulas (1) and (2) in relation to the evaluation frequency $f_r$.

[Evaluation Method]

The same test as the test of the above [1] was performed. Here, the dimensions of the housing were changed as follows.

width a: 22.6 mm
height b: 10.8 mm
length L: 63.5 mm

The actual measurement and the simulation were performed in three cases, that is, the case where the electromagnetic wave absorber was not provided in the housing, the case where the electromagnetic wave absorber containing 40% by volume of the same soft magnetic powder as that of the test in the above [1] was provided, and further the case where the electromagnetic wave absorber containing 15% by volume of the soft magnetic powder was provided.

[Evaluation Result]

FIGS. 4A and 4B show results of the actual measurement and the simulation, respectively. In any case, a complicated spectrum behavior in which the electromagnetic wave transmittance finely fluctuates up and down is obtained. Spectral shapes complicated to the same level or higher than that of the experiment are also obtained in the simulation, and thus it can be said that such complicated spectral shapes are not caused by a non-essential phenomenon at the time of the actual measurement, such as accidental noise or a fluctuation in a measurement condition, but are caused by an essential phenomenon occurring in the housing.

In addition, in both the actual measurement and the simulation, even in the case where the presence or absence of the electromagnetic wave absorber and the content of the soft magnetic powder in the electromagnetic wave absorber change, a clear change in behavior exceeding a level of the fine vertical fluctuation cannot be confirmed in the spectrum. That is, it is difficult to evaluate the characteristics of the electromagnetic wave absorber in a meaningful manner.

When the dimensions a, b, and L of the housing used here are substituted into Formulas (1) and (2), the resonance frequency (the evaluation frequency $f_r$) satisfying Formulas (1) and (2) exists only in a low frequency region of 13.5 GHz or less, and does not exist in the region of 20 GHz or more. That is, in the frequency range at which the actual measurement and the simulation were performed, there is no condition for providing the clear resonance peaks as in the case of the test in the above [1], and it is considered that the above causes the complicated spectral shapes as in FIGS. 4A and 4B to be obtained in the actual measurement and the simulation. It is considered that such complicated spectral shapes are caused by the random occurrence of the high-order resonance with the low intensity and at the small frequency intervals as in the region of 36 GHz or more in FIG. 3A.

Although the embodiment of the present invention has been described in detail above, the present invention is not limited to the above embodiment and the examples, and various modifications can be made without departing from the gist of the present invention.

The present application is based on Japanese Patent Application No. 2022-168793 filed on Oct. 21, 2022, and the contents thereof are incorporated herein by reference.

REFERENCE SIGNS LIST 1 (electromagnetic wave absorber) evaluation apparatus;
2 housing;
21 bottom plate;
22 upper cover;
3 substrate;
31 dielectric substrate;
32 conductor layer;
4 input microstrip line;
41 input end;
42 terminal unit;
5 output microstrip line;
51 terminal unit;
52 output end;
a width of housing;
b height of housing;
L length of housing;
t plate thickness of housing;
w line width

What is claimed is:

1. An electromagnetic wave absorber evaluation apparatus for evaluating characteristics of an electromagnetic wave absorber, the apparatus comprising:
a housing in which the electromagnetic wave absorber is allowed to be arranged, the housing being made of a conductive material with inner dimensions of a width a, a height b, and a length L, as b≤a≤L;
a substrate arranged inside the housing;
an input microstrip line and an output microstrip line formed on the substrate along a length direction of the housing and separated from each other in the length direction; and
a signal inspecting unit capable of inputting an input signal having a frequency of 20 GHz or more into the input microstrip line and detecting an output signal output through the output microstrip line, wherein an evaluation frequency $f_t$ obtained by the following Formula (1) satisfies the following Formula (2) in a frequency region of 20 GHz or more, $$f_t = \frac{1}{2\alpha}\sqrt{\left(\frac{m}{a}\right)^2 + \left(\frac{p}{L}\right)^2} \quad (1)$$

$$\frac{1}{2\alpha a} \leq f_t \leq \frac{1}{2\alpha b} \quad (2)$$

where m and p are mutually independent and are integers of 1 or more, $\alpha$ is expressed by Formula (5) using $\mu_r$ and $\varepsilon_r$ obtained based on the following Formula (3) and Formula (4) in the case where n substances exist in a region surrounded by the housing and when setting a complex relative magnetic permeability of an i-th substance among the substances to $\mu_{ri}$, a complex relative dielectric constant thereof to $\varepsilon_{ri}$, and an area occupied by a cross section thereof orthogonal to the length direction of the housing to $S_i$, $\mu_0$ is a vacuum magnetic permeability and $\varepsilon_0$ is a vacuum dielectric constant, $$\mu_r = \sum_{i=1}^{n} \frac{\mu_{ri} S_i}{ab} \quad (3)$$

$$\varepsilon_r = \sum_{i=1}^{n} \frac{\varepsilon_{ri} S_i}{ab} \quad (4)$$

$$\alpha = \left|\sqrt{\mu_r \mu_0 \varepsilon_r \varepsilon_0}\right|. \quad (5)$$

2. The electromagnetic wave absorber evaluation apparatus according to claim 1, wherein
in the input microstrip line and the output microstrip line, termination resistors are respectively connected to end portions facing each other.

3. The electromagnetic wave absorber evaluation apparatus according to claim 1, wherein
the substrate is arranged along a bottom surface of the housing,
the electromagnetic wave absorber is at least allowed to be arranged at a position facing the substrate along a ceiling surface of the housing, and
a distance between the substrate and the electromagnetic wave absorber arranged along the ceiling surface of the housing is 0.01 mm or more.

4. The electromagnetic wave absorber evaluation apparatus according to claim 1, wherein
each of the input microstrip line and the output microstrip line has a line width w, and a displacement amount between the input microstrip line and the output microstrip line along a width direction of the housing is w/2 or less.

5. The electromagnetic wave absorber evaluation apparatus according to claim 1, wherein
a constituent material of the housing has an electric resistivity of 150 μΩ·cm or less, and a plate thickness of a portion at least covering an upper surface and side surfaces of the substrate is 0.01 mm or more.

6. The electromagnetic wave absorber evaluation apparatus according to claim 1, wherein
the input microstrip line and the output microstrip line are separated from wall surfaces of the housing on both sides by b/10 or more in a width direction of the housing.

7. The electromagnetic wave absorber evaluation apparatus according to claim 1, wherein
end portions not facing each other of the input microstrip line and the output microstrip line are separated from wall surfaces of the housing by ⅙ or more of a wavelength corresponding to the evaluation frequency $f_t$ along the length direction of the housing.

8. An electromagnetic wave absorber evaluation method, the method comprising:
arranging an electromagnetic wave absorber to be evaluated inside the housing with the electromagnetic wave absorber evaluation apparatus according to claim 1; and
evaluating characteristics of the electromagnetic wave absorber by inputting an input signal in a frequency range including the evaluation frequency $f_t$ into the input microstrip line, and detecting an output signal output through the output microstrip line.

9. The electromagnetic wave absorber evaluation method according to claim 8, the method further comprising:
evaluating the characteristics of the electromagnetic wave absorber based on at least one of a comparison between a case where the electromagnetic wave absorber is arranged in the housing and a case where the electromagnetic wave absorber is not arranged in the housing, and a comparison between the case where the electromagnetic wave absorber is arranged in the housing and a case where a different electromagnetic wave absorber is arranged in the housing.

10. The electromagnetic wave absorber evaluation method according to claim 8, wherein
the electromagnetic wave absorber is used in a high-frequency communication device having a communication frequency of 20 GHz or more,
when the communication frequency is regarded as the evaluation frequency $f_t$, dimensions of the housing are designed to satisfy Formulas (1) and (2), and
then the characteristics of the electromagnetic wave absorber are evaluated in a frequency range including the communication frequency.

* * * * *